United States Patent [19]

Herrington

[11] Patent Number: 4,881,974
[45] Date of Patent: Nov. 21, 1989

[54] SILVER-GLASS PASTE

[75] Inventor: Thomas Herrington, Romona, Calif.

[73] Assignee: Johnson Matthey, Inc., Valley Forge, Pa.

[21] Appl. No.: 116,949

[22] Filed: Nov. 5, 1987

[51] Int. Cl.$^4$ ............................ C09D 5/00; B22F 1/00
[52] U.S. Cl. .................................. 106/1.14; 106/1.19; 252/514
[58] Field of Search ............................ 106/1.14, 1.19; 252/514

[56] References Cited

U.S. PATENT DOCUMENTS

| 4,401,767 | 8/1983 | Dietz et al. | 106/1.13 |
|---|---|---|---|
| 4,459,166 | 7/1984 | Dietz et al. | 106/1.13 |
| 4,462,827 | 7/1984 | Rellick | 106/1.19 |
| 4,636,254 | 1/1987 | Husson, Jr. et al. | 106/1.14 |

OTHER PUBLICATIONS

Derwent Abstracts, AN 79-42034B/22, "Paste for Metallising Ceramics for Capacitor Mfr.", 7/19/78, Soviet Union Patent No. 617443.

Primary Examiner—Paul Lieberman
Assistant Examiner—Christine A. Skane
Attorney, Agent, or Firm—Cushman, Darby & Cushman

[57] ABSTRACT

A silver-glass paste consisting essentially of silver flake, silver oxide, lead borate glass, resin, thixotrope and solvent.

4 Claims, No Drawings

SILVER-GLASS PASTE

BACKGROUND OF THE INVENTION

The present invention relates to an improved silver-glass paste composition for use in attaching semiconductive elements, e.g., silicon, GaAs elements or the like, to appropriate substrates.

Prior patents directed to pastes of this general type include U.S. Pat. Nos. 3,497,774; 4,401,767; 4,436,785; 4,459,166 and 4,636,254.

The paste of the invention consists essentially of the following components:
silver flake
silver oxide
lead borate glass
resin
thioxtrope
solvent The silver flake should have a surface area of 0.5–1.0 $m^2/g$ and a tap density of 2.5–4.0 gram/cc. For present purposes, it is desirable that the silver flake is essentially uniform in size. The amount of flake used can be varied but usually will fall in the range of 55–75%, based on the total weight of the paste.

Silver oxide as used herein is available commercially in particulate form. The particle size of the silver oxide may be varied although this is generally such that it will pass through a 200 mesh screen and be retained on a 325 mesh screen (U.S. sieve size). The amount of silver oxide included will usually fall in the range of 0.5 to 2% based on the weight of the paste.

The lead borate glass should be silica- and sodium-free. Normally this glass will comprise a lead borate frit having a softening point in the range of 325° C. to 425° C., a coefficient of thermal expansion no higher than about 15 ppm/°C., a surface area of at least about 0.3 $m^2/gm$ and a tap density of up to about 4 gm/cc. Usually the glass will comprise 10–25% of the weight of the paste.

A variety of different resin components can be used for present purposes. This includes lower alkyl methacrylates such as methyl, ethyl or isobutyl methacrylate, the latter being preferred. This component usually comprises from about 0.5–2.0% by weight of the paste.

The thixotrope is preferably hydrogenated castor oil comprising about 0.5 to 2.0% by weight of the paste. This helps to form a three-dimensional network structure which increases the yield point to prevent dripping in dispensing and particle settling during storage. The thixotrope provides a lower viscosity at high sheer rate which prevents string formation of the paste during dispensing and fast yield point recovery for better pattern definition.

The composition of the solvent can be widely varied. However, the solvent should be one which has a boiling range of 120°–200° C. This allows for a one pass paste that requires no drying. A particularly useful solvent comprises an alcohol, notably 2-octanol, preferably in mixture with minor amounts (e.g., 1–20% by weight of the solvent total) of additives such as benzyl alcohol and 4-hydroxy-3-methoxy benzaldehyde.

The paste of the invention may be prepared and used in the manner described in the patents referred to above. An advantage of the present paste is that it can be used to attach a semiconductor to a substrate by firing the composite without prior drying. This significantly reduces assembly time and facilitates rapid in-line operations.

A preferred paste according to the invention is described below where percents given are on a weight basis:

| | |
|---|---|
| silver flake | about 66% |
| silver oxide ($Ag_2O$) | about 1% |
| lead borate glass | about 16% |
| isobutyl methacrylate | about 0.5% |
| hydrogenated castor oil | about 0.5% |
| 2-octanol | about 15% |
| benzyl alcohol | about 0.5% |
| 4-hydroxy-3-methoxy-benzaldehyde | about 0.5% |
| | 100% |

Essentially equivalent results can be obtained by increasing the amount of isobutyl methacrylate and hydrogenated castor oil over the range from 0.5 to 2.0%. Similarly, the amount of benzyl alcohol and 4-hydroxy-3-methoxy-benzaldehyde can be varied from 0.5 to 1.0%, with consequent reduction in the amount of glass and/or silver flake. However, the total amount of solids will usually comprise 75–85% by weight of the paste.

It will be appreciated that various modifications are contemplated. Hence, the invention is defined in the following claims wherein:

What is claimed is:

1. A silver-glass paste consisting essentially of, on a weight basis, 55–75% silver flake, 0.5–2% silver oxide, 10–25% lead borate glass, 0.5–2% resin, 0.5–2% thixotrope and solvent, the thixotrope being hydrogenated castor oil.

2. A paste according to claim 1 wherein the silver flake has a surface area of 0.5–1.0 $m^2/g$ and a tap density of 2.5–4.0 g/cc, the glass is silica- and sodium-free, the resin is isobutyl methacrylate and the solvent is one having a boiling range of 120°–200° C.

3. A paste according to claim 2 wherein the solvent comprises a mixture of octanol, benzyl alcohol and 4-hydroxy-3-methoxy-benzaldehyde.

4. A paste according to claim 2 consisting essentially of the following:

| | |
|---|---|
| silver flake | about 66% |
| silver oxide | about 1% |
| lead borate glass | about 16% |
| resin | about 0.5–2.0% |
| thixotrope | about 0.5–2.0% |
| 2-octanol | about 15% |
| benzyl alcohol | about 0.5–1.0% |
| 4-hydroxy-3-methoxy-benzaldehyde | about 0.5–1.0% |

* * * * *